(12) United States Patent
Esterbauer et al.

(10) Patent No.: US 9,888,588 B2
(45) Date of Patent: Feb. 6, 2018

(54) FRAME AND INPUT AND OUTPUT DEVICE COMPRISING SAID FRAME

(71) Applicant: BERNECKER + RAINER INDUSTRIE-ELEKTRONIK Ges.m.b.H., Eggelsberg (AT)

(72) Inventors: Hermann Esterbauer, Tarsdorf (AT); Johann Wimmer, Handenberg (AT)

(73) Assignee: BERNECKER + RAINER INDUSTRIE-ELEKTRONIK Ges.m.b.H., Eggelsberg (AT)

( * ) Notice: Subject to any disclaimer, the term of this patent is extended or adjusted under 35 U.S.C. 154(b) by 0 days.

(21) Appl. No.: 15/182,112

(22) Filed: Jun. 14, 2016

(65) Prior Publication Data
US 2016/0366773 A1 Dec. 15, 2016

(30) Foreign Application Priority Data
Jun. 15, 2015 (AT) .............................. A 50490/2015

(51) Int. Cl.
*G06F 1/16* (2006.01)
*G02F 1/1333* (2006.01)
*H05K 5/00* (2006.01)

(52) U.S. Cl.
CPC ..... *H05K 5/0017* (2013.01); *G02F 1/133308* (2013.01); *G02F 2001/13332* (2013.01);
(Continued)

(58) Field of Classification Search
None
See application file for complete search history.

(56) References Cited

U.S. PATENT DOCUMENTS 7,745,739 B2 * 6/2010 Ingenbleek ............ H05K 5/061
174/521
7,755,907 B2 * 7/2010 Inagaki ............... B60R 16/0239
174/50.5
(Continued)

FOREIGN PATENT DOCUMENTS

CN 203279402 11/2013
CN 203393093 1/2014
(Continued)

OTHER PUBLICATIONS

Europe Search Report conducted in counterpart Europe Appln. No. 16 17 0904 (Sep. 20, 2016).
(Continued)

*Primary Examiner* — Xanthia C Cunningham
(74) *Attorney, Agent, or Firm* — Greenblum & Bernstein P.L.C.

(57) ABSTRACT

In order to produce a frame (2) for an input and output device (1) and an input and output device (1) provided with said frame (2) for industrial applications in the most inexpensive manner possible, the invention provides that the frame (2) is composed of a plurality of individual frame parts (2a, 2b, 2c, 2d) and the frame parts (2a, 2b, 2c, 2d) are joined at contiguous abutment surfaces (15) of the frame parts (2a, 2b, 2c, 2d) in order to form the frame (2), and that in the region of an abutment surface (15), a through recess (20) is arranged which is connected to the abutment surface (15) and connects a first end face of the frame (2) to an opposite second end face of the frame (2), the through recess (20) being filled in with a sealant (26).

12 Claims, 4 Drawing Sheets

(52) U.S. Cl.
CPC ............. *G02F 2001/133311* (2013.01); *G02F 2001/133325* (2013.01); *G02F 2202/28* (2013.01); *G06F 1/1601* (2013.01)

(56) References Cited

U.S. PATENT DOCUMENTS

| | | | | |
|---|---|---|---|---|
| 8,305,763 | B2* | 11/2012 | Kato | ................ H05K 5/006 |
| | | | | 361/730 |
| 8,687,374 | B2* | 4/2014 | Watanabe | ............ H05K 5/0052 |
| | | | | 361/752 |
| 8,908,380 | B2* | 12/2014 | Ohhashi | ............... H05K 5/0052 |
| | | | | 174/535 |
| 8,942,001 | B2* | 1/2015 | Kawai | ................. H05K 5/0052 |
| | | | | 174/50.5 |
| 9,078,367 | B2* | 7/2015 | Tamura | ................ H05K 5/0052 |
| 9,253,899 | B2* | 2/2016 | Hongo | ................ G06F 1/1626 |
| 9,428,225 | B2* | 8/2016 | Minei | .................. B62D 27/026 |
| 2004/0195783 | A1* | 10/2004 | Akagi | .................... F16J 15/027 |
| | | | | 277/645 |
| 2006/0023431 | A1* | 2/2006 | Wetzel | ................ B60R 16/0239 |
| | | | | 361/739 |
| 2008/0066956 | A1* | 3/2008 | Lawlyes | ................ H05K 5/062 |
| | | | | 174/535 |
| 2008/0151479 | A1 | 6/2008 | Tsai | |
| 2009/0068862 | A1* | 3/2009 | Honda | ................. H05K 5/0052 |
| | | | | 439/78 |
| 2010/0258458 | A1 | 10/2010 | Nommer et al. | |
| 2012/0274102 | A1* | 11/2012 | Ertl | ........................ B60J 10/02 |
| | | | | 296/201 |
| 2013/0113167 | A1 | 5/2013 | Schwaiger | |
| 2015/0116629 | A1 | 4/2015 | Dai | |
| 2016/0139451 | A1 | 5/2016 | Dai | |

FOREIGN PATENT DOCUMENTS

| | | |
|---|---|---|
| CN | 2844970 | 12/2016 |
| DE | 102007060760 | 6/2009 |
| EP | 2590489 | 11/2012 |
| EP | 2 590 489 | 5/2013 |
| JP | 2000-039850 | 2/2000 |
| KR | 1020050027375 | 3/2005 |
| WO | 2014194544 | 12/2014 |

OTHER PUBLICATIONS

Austria Search Report conducted in counterpart Austria Appln. No. A50490/2015 (May 31, 2016) (Partial machine translation).

\* cited by examiner

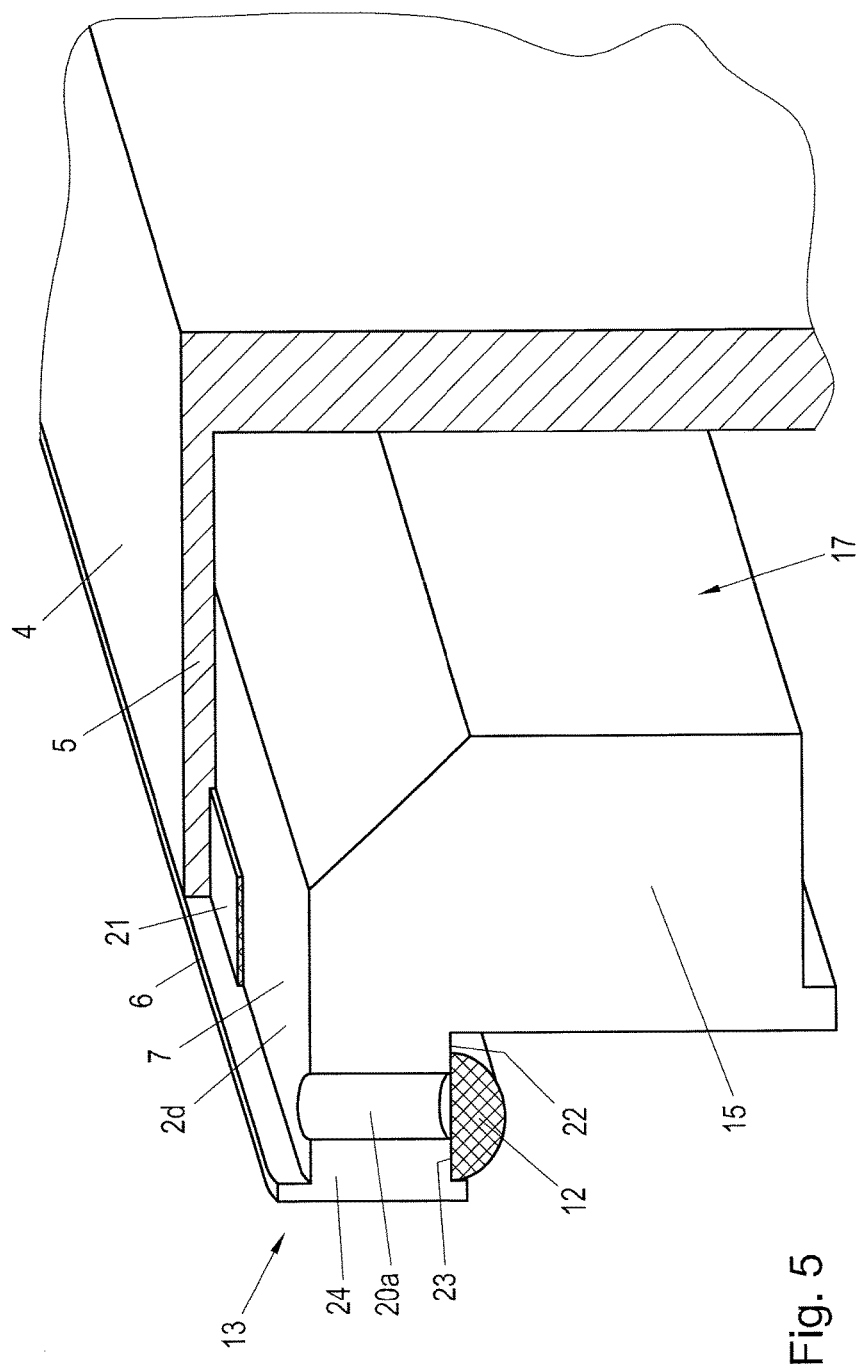

FRAME AND INPUT AND OUTPUT DEVICE COMPRISING SAID FRAME

The present invention relates to a frame for an input and output device, wherein the frame is composed of a plurality of individual frame parts, the frame parts being assembled at abutting abutment surfaces in order to form the frame. The invention further relates to an input and output device comprising said frame, and a method for producing the frame and producing the input and output device.

Most modern input and output devices—such as a human-machine interface—are based on display or touchscreen technology, as input and output units. Buttons, knobs, switches, and the like are also widely used as input and output units. This is also particularly and ever-increasingly true of industrial applications, such as, for example, the control of machinery and equipment. Due to increasing automation, corresponding image-reproducing input and output devices—such as, for example, displays, touch-screens, and the like—are widely used on machine tools, processing machines, industrial machinery, switch cabinets, monitoring and control units for process control and scheduling, and the like.

It is precisely because of the use of input and output devices, in the context of industrial use, that there has been a corresponding increase in the demands on such devices in the industrial environment as regards mechanical robustness and resistance to external influences and conditions. These demands are in no way comparable to the demands on conventional input and output devices, in particular, displays such as are found, for example, in monitors and television sets in private settings.

Typically, input and output devices for industrial applications are configured so that these input and output devices are provided with correspondingly stable and durable housings or frames. For this reason, device frames input and output devices in industrial applications are constructed out of metal—typically aluminum.

In addition, there may also be demands on the seal tightness of the input and output devices, because in an industrial environment there is often splashing or spraying of water, against which the display must be sealed. Also, cleaning of machinery or equipment creates the risk of exposure to splashed or sprayed water, against which the display should be protected.

Similarly, demands of a hygienic nature are also often relevant. This entails, in particular, preventing to the greatest extent possible the potential for fouling to be deposited on the display. Above all, grooves, slits, and indentations on the display or display frame are to be avoided.

In order to be able to meet all these requirements, according to the prior art, displays for industrial applications are fabricated with one-piece frames that accommodate the frame.

Due to the small quantities of such displays for industrial use, these frames are fabricated according to the prior art by machine-cutting from an integral material, e.g., by milling. Naturally, this incurs very high material loss, raising the costs for such display frames and also rendering the production costly and inefficient.

Basically, such one-piece display frames could also be fabricated in die-casting or injection-molding processes, but due to the low-volume series, so doing brings little benefit, because of the high tool costs (for example, for die casting dies).

CN 2844970 Y discloses a frame for an LCD display, which is composed of individual frame parts. The frame parts are then cut out from a plate of the display material and combined to make a frame, the flat frame parts being joined at the abutting points (for example, by soldering, welding, or riveting). Then, the corners of the flat frame are stamped out and the sides are folded over to form a frame having an L-shaped cross-section. It is obvious that such a frame cannot be sealed at the corners where the folded-over sides abut against one another. Such a frame is therefore unsuitable for industrial applications.

KR 10 2005 0027375 A also discloses a frame for a flat panel display that is composed of individual frame parts. The frame parts here are plastic parts in the form of pressed parts that are welded at the abutting points. At the corners, the frame has a recess, rendering the frame unsealed, and therefore unsuitable for industrial applications.

Moreover, a frame for an input and output device for industrial applications generally has a complex cross-sectional shape that essentially arises from the need for grooves for accommodating seals, for fastening onto other components, or for other components, as well as grooves and recesses for accommodating the input and output device itself. The frames are then given the smallest dimensions possible. This makes it scarcely possible to completely weld or solder at the abutting points, for manufacturing-related reasons, or necessitates elaborate post-processing.

The present invention therefore addresses the problem of providing a frame for an input and output device and an input and output device for industrial applications that can be produced in the most inexpensive manner possible, and that moreover meets the aforementioned demands in industrial contexts, especially the sealing demands.

This problem is solved according to the invention by arranging, in the region of an abutment surface, a through recess that is connected to the abutment surface and that connects one end face of the frame with another opposite end face of the frame, the through recess being filled in with a sealant. The through recess, divided by the abutment surface, closes the gap between the adjacent frame parts, due to the sealant in the through recess. This makes it impossible for any medium to penetrate from the outside into the frame through this gap, and completely closes the frame along the outer peripheral surface.

Such a frame also offers a simple manner to configure an input and output device for industrial applications, by setting an input and output unit in a central recess of the frame. Due to the sealed frame, the input and output device meets the high demands for seal tightness.

The end faces that are connected by the through recess are preferably formed of the bottom of a peripheral groove in the outer end face of the frame and the bottom of an opposite sealing recess. It is also advantageous to provide, on the frame, a peripheral collar so as to extend continuously and uninterrupted over the entire circumference of the frame, and that forms the inner end face.

In order to seal off the input and output device at the end faces, it is advantageous to arrange a sealing element between the frame and the input and output unit, or to provide a cover film that covers at least a gap between the frame and the input and output unit.

The method according to the invention is characterized in that: frame parts are cut from a section bar to form the abutment surfaces; the frame parts are laid one next to each other in a contiguous manner and joined on the abutment surfaces to form the frame; a through recess is formed in the region of abutting abutment surfaces, the through recess being divided by the abutment surfaces; and the through recess is filled in with a sealant. This method may make use of available, inexpensive semi-finished products in the form of finished section bars that need only be cut to the correct length. The method also makes it possible to easily produce frames of any dimension. Sealing off the frame only requires filling a through recess with a sealant, which is also a simple step that can be automated. Thus, the frame can be easily produced in few steps and even in a fully automated manner. Post-processing of the frame produced in this manner is no longer necessary, thus also making production thereof particularly economical.

For hygienic reasons, it may be advantageous for the frame to be painted, anodized, or adhered over with a film on the outside, at least in part, because so doing makes it possible to close any remaining gaps in which fouling or bacteria can accumulate.

The present invention shall be described in further detail below with reference to accompanying FIGS. 1 to 5, which illustrate advantageous embodiments of the invention by way of example, in a schematic and non-restrictive manner.

FIG. 5 illustrates a detail view of an abutment surface of a frame part of the frame according to the invention.

Figure 1:
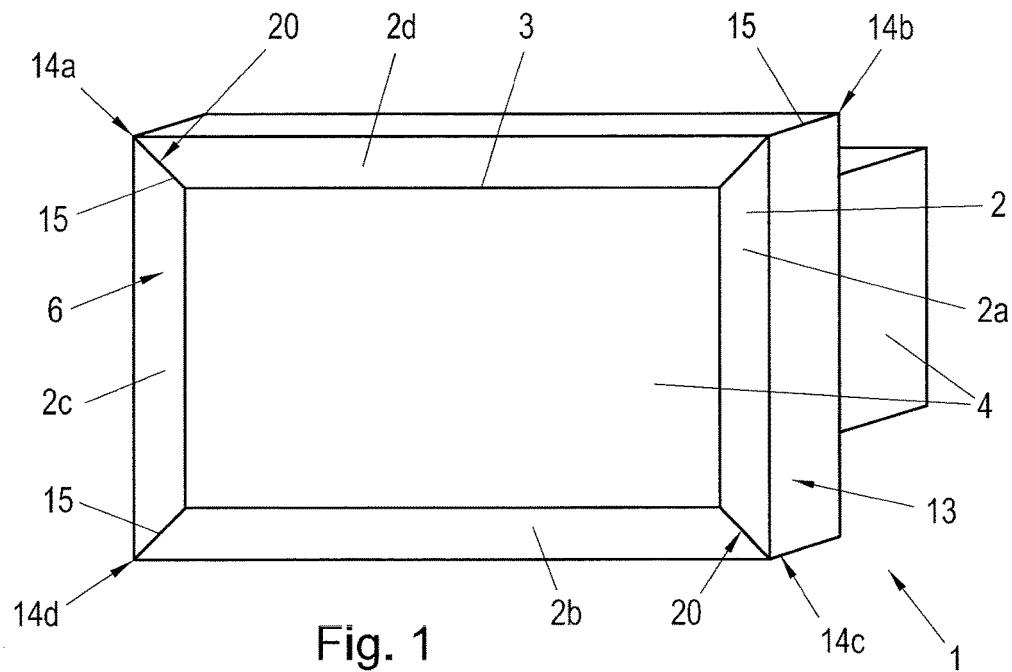
FIG. 1 illustrates an input and output device according to the invention.

FIG. 1 illustrates an input and output device 1 according to the invention for an industrial environment, with a frame 2 having a central recess 3 axially passing through the frame 2, into which is set an input and output unit 4, e.g., a display, a touch screen, a unit having buttons, knobs, or switches, or a combination of such elements. The input and output unit 4 may be set in a variety of manners into the input and output device 1. The input and output device 1 or the frame 2 has an outer peripheral surface 13 and an outer end surface 6, which are visible in the intended use of the input and output device 1.

Figure 2:
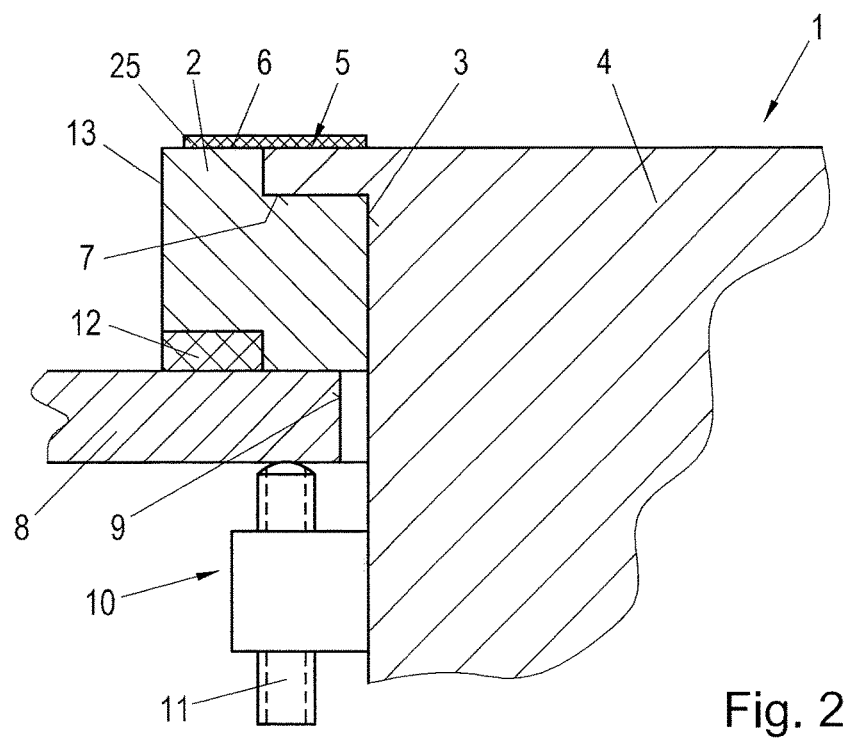
FIG. 2 illustrates the mounting of the input and output device according to the invention, on a support plate.

In the embodiment according to FIG. 2, the input and output unit 4 comprises an outer peripheral ridge 5 encircling the circumference. On the outer end face 6 thereof—i.e., the end face that is visible in the intended use of the input and output device 1, the frame 2 has a peripheral groove 7 which is complementary to the peripheral ridge 5 and in which the peripheral ridge 5 comes to rest. Preferably, the peripheral ridge 5 and the peripheral groove 7 are dimensioned to obtain a flush, continuous outer end surface of the input and output device 1, as indicated in FIG. 2. The input and output unit 4 may, however, also come up directly against the end face 6; no peripheral groove 7 would be required therefor. The input and output unit 4 may be adhered to the frame 2, preferably between the peripheral ridge 5 and the peripheral groove 7, for the purpose of fixation onto the frame 2. The adhesion may be provided by means of, for example, a dispensed adhesive that simultaneously also acts as a sealing element 21 and can ensure the tightness of the site of adhesion. For this, it is advantageous to apply the adhesive between the peripheral ridge 5 and the peripheral groove 7 so as to be closed over the circumference. However, it would also be possible to fix the input and output unit 4 in other or additional manners to the frame 2, for example, by threaded, clipped, or snapped connections, or the like. There may also be other—or additional—suitable sealing elements 21, such as, for example, O-rings, arranged between the peripheral groove 7 and the peripheral ridge 5.

The input and output device 1 is generally set into a mounting recess 9 of a support plate 8, e.g., on a switch cabinet or a control panel of a machine, wherein the frame 2 rests against the support plate 8 and the input and output device 1 is connected by the frame 2 to the support plate 8, as illustrated in FIG. 2. There may be provided, for example, a fastening device 10 on the input and output unit 4, for example, in the form of a screw 11, with which the input and output device 1 can be fastened to the support plate 8. The screw 11 makes it possible to clamp the frame 2 against the support plate 8, and thus to fix the input and output device 1. A seal 12—such as is described, for example, in EP 2 590 489 A2, may also be arranged between the frame 2 and the support plate 8. However, the seal 12 may also be realized as dispensed adhesive, the adhesive being applied to the support plate 8 when the input and output device 1 is mounted. For a completely tight seal, the adhesive should be applied so as to be closed over the circumference.

Figure 3:
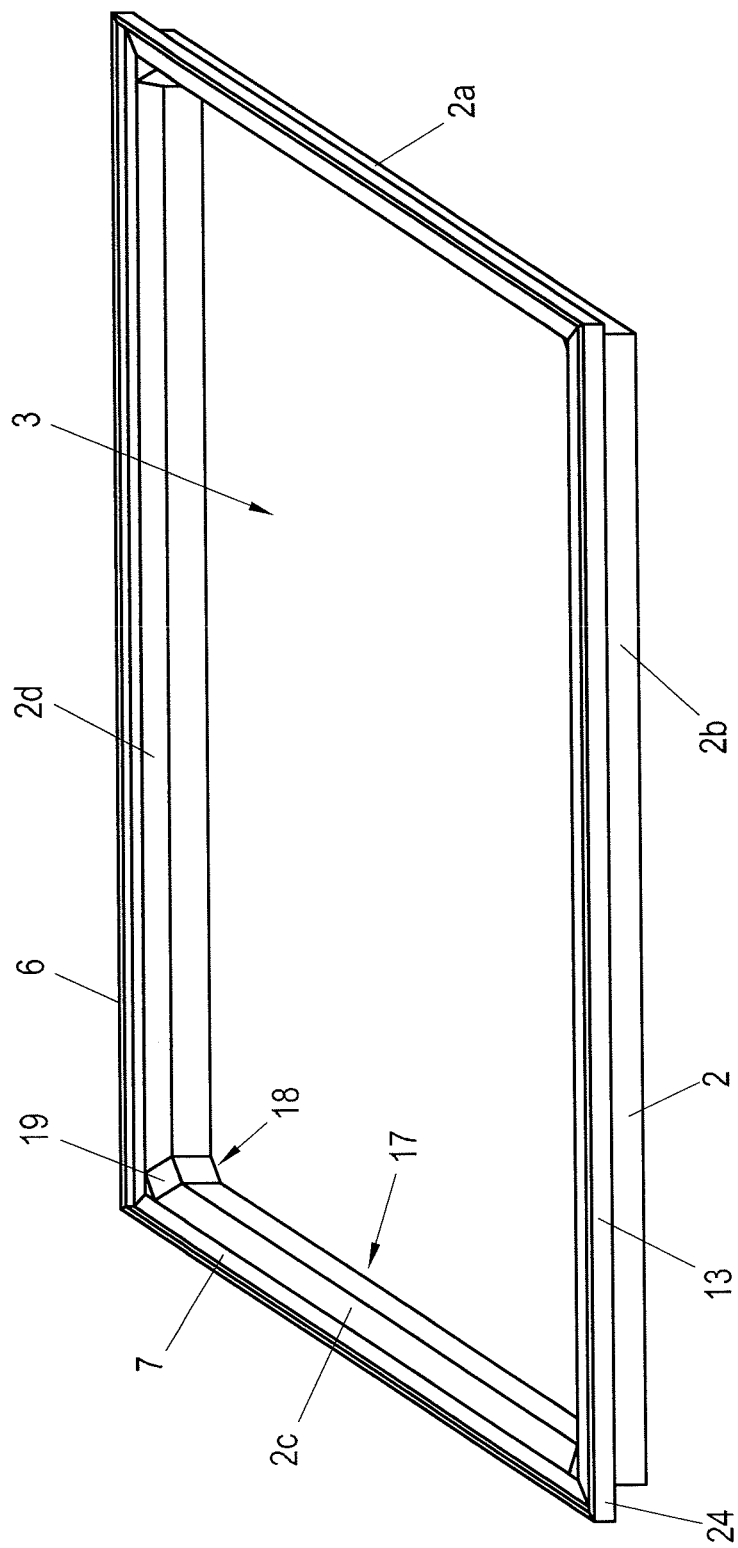
FIG. 3 illustrates a preferred embodiment of the frame according to the invention.
Figure 4:
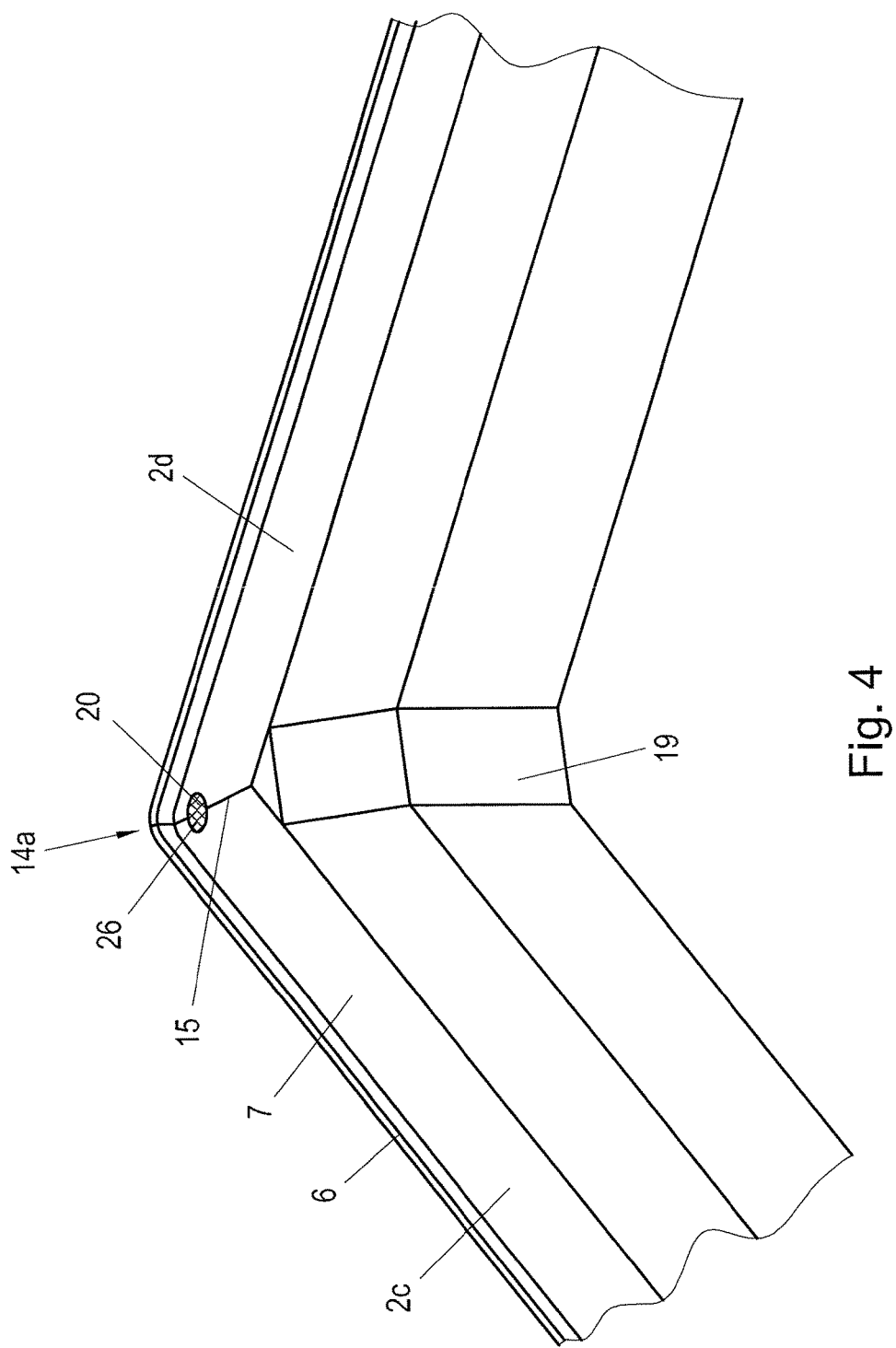
FIG. 4 illustrates a detailed view of a corner of the frame according to the invention.

The frame 2 is, according to the invention, composed of a plurality of individual frame parts: 2a, 2b, 2c, 2d, there being four frame parts in the example according to FIG. 1. The frame parts 2a, 2b, 2c, 2d are preferably formed of section bars—made, for example, of metal or plastic—that have been cut to the required length The section bars may be solid section bars or hollow section bars having essentially any cross-section. Advantageously, the metal or plastic section bars forming the frame parts 2a, 2b, 2c, 2d are extruded section bars and/or pultruded section bars. Extrusion represents a particularly cost-effective and efficient technique for producing corresponding section bars, and is widely used for this reason. Such section bars can be obtained inexpensively, rapidly, and in sufficient quantities The frame parts 2a, 2b, 2c, 2d are connected to one another at the corners 14a, 14b, 14c, 14d of the frame 2. To achieve this, the frame parts 2a, 2b, 2c, 2d, may be mitered at the corners 14a, 14b, 14c, 14d, as illustrated in FIG. 1. Instead of mitering, the frame parts 2a, 2b, 2c, 2d may also be simply arranged jointlessly in an abutting manner at the corners 14a, 14b, 14c, 14d, especially with solid section bars. It is also possible to galvanize the frame parts 2a, 2b, 2c, 2d at the corners 14a, 14b, 14c, 14d. In principle, it would also be possible to form the abutting points not at the corners, but rather somewhere along the sides of the frame 2. Two U-shaped frame parts or U-shaped and straight frame parts would then be joined. The U-shaped frame parts to be joined could be produced from cut section bars in an intermediate step Each two mutually abutting frame parts 2a, 2b, 2c, 2d are connected to one another by a joining method at the mutually facing abutment surfaces 15 thereof, e.g., mitered surfaces, abutting points, or galvanized surfaces, such as shall be described in greater detail below with reference to FIGS. 3 to 5.

Due to the complex cross-sectional shape of the frame 2, for example, with the peripheral groove 7 and the sealing recess 23 for the seal 12, and the small dimensions thereof, the joining process renders production expensive if the desired tightness and clean surface are to be achieved. For industrial applications, the finished input and output device 1 must be completely closed at the outer end face 6 and at the outer peripheral surface 13 of the frame 2. Being completely closed signifies that no medium—for example, sprayed or splashed water, or cleaning agent—can penetrate to the interior of the input and output device 1 from the outside. For this purpose, the inside of frame 2 must also be completely sealed off from the outside, which is ensured by the frame 2 and production process according to the invention described below.

The frame 2 according to the invention in FIG. 3 is composed again of four frame parts 2a, 2b, 2c, 2d that are mitered at the corners and are arranged resting against one another at the mitered surfaces forming the abutment surfaces 15, in order to form the frame 2. The frame parts 2a, 2b, 2c, 2d are welded at the inner side 17 of the frame 2, with a welded seam 19 in the resulting inner corners 18. Preferably, though not compulsorily, the welded seam 19 extends over the height of the inner side 17 of the frame 2, as is also depicted in the detail in FIG. 4.

Instead of welding, it would also be possible to use another suitable joining method, in particular, a materially-integral joining method. For example, abutting frame parts 2a, 2b, 2c, 2d could be soldered at different points or adhered at different places to the abutment surfaces 15.

At the end face, the frame is 2 is, as described above and as shown in FIG. 5, sealed off by the input and output unit 4 and the sealing element 21 between the input and output unit 4—preferably the peripheral ridge 5—and the frame 2—preferably the peripheral groove 7. The sealing element 21 then surrounds the central recess 3 for accommodating the input and output unit 4, and is closed over the circumference. If no sealing element 21 is arranged, then the frame 2 may also be sealed off at the end face by a cover film 25 that is bonded at the end face over the input and output unit 4 and the adjoining outer end surface 6 of the frame 2, after the input and output unit 4 has been set in (as shown in FIG. 2). With the cover film 25, the input and output unit 4 could also be simultaneously fixed into the frame 2. The cover film 25 must then cover at least the gap between the frame 2 and the input and output unit 4. The inside of the frame 2 is then sealed off at the end face from the outside, i.e., no medium is able to penetrate in via the outer end face of the input and output device 1.

Moreover, in order to seal off also the inside of the peripheral surface 13 of the frame 2, a through recess 20—for example, a hole—is provided in the region of the abutment surface 15, the through recess 20 being connected to the abutment surface 15 at the frame 2. The through recess 20 is either introduced after the abutting frame parts 2a, 2b, 2c, 2d have been joined, by perforation of the frame 2. It is also possible for recesses 20a—which form the through recess 20 after the frame parts 2a, 2b, 2c, 2d have been joined together—to be incorporated at the frame parts 2a, 2b, 2c, 2d, into the abutment surfaces 15. In this case, the through recess 20 is divided by the abutment surfaces 15. However, it is fundamentally sufficient for only one of two abutting frame parts 2a, 2b, 2c, 2d to have such a recess 20a, provided that the recess 20a is connected to the abutment surface 15. This through recess 20 is filled in completely with a sealant—for example, by pouring or spraying—after the frame parts 2a, 2b, 2c, 2d have been joined. The through recess 20 must extend between an outer first and inner second end face of the frame 2, e.g., between the bottom of the peripheral groove 7 or the end face 6 and the opposite end face 22. Preferably, the through recess 20 extends between the bottom of the peripheral groove 7 and the bottom of a sealing recess 23 which is introduced at the opposite end face 22 and in which the seal 12 for the support plate 8 is arranged.

Advantageously, provided on the frame 2 is a peripheral collar 24 that protrudes around the circumference and forms the inner end face 22 opposite to the outer end face 6. The peripheral collar 24 may then rest against the support plate 8, and the frame 2 can be set into the mounting recess 9. This also makes it possible to fasten the fastening device 10 onto the frame 2 and not onto the input and output unit 4.

The through recess 20, having been filled in with the sealant 26, seals the frame 2 off from penetration by a medium through the outer peripheral surface 13 and along the abutting abutment surfaces 15.

It shall be readily understood that the positions of the seal 12—and optionally the sealing element 21—and the through recess 20 have to be adapted to one another in order to fulfill the sealing function. The through recess 20 must not be arranged farther away from the outer peripheral surface 13 than the seal 12, because otherwise medium would be able to penetrate through between the seal 12 and the through recess 20. Preferably, the through recess 20 and the seal 12 at least partially overlap (as shown in FIG. 5). For this purpose, the through recess 20 preferably leads at least partially into the sealing recess 23. The through recess 20 also must not be arranged closer to the outer peripheral surface 13 than a sealing element 21, because otherwise, it will be possible for medium to penetrate through between the sealing element 21 and the through recess 20. Preferably, the through recess 20 and the sealing element 21 at least partially overlap (as shown in FIG. 5). If a cover film 25 is used for the sealing, the position of the through recess 20 at the bottom of the peripheral groove 7 is irrelevant.

Fundamentally, it is advantageously to arrange the through recess 20 as close as possible to the outer peripheral surface 13. So doing makes it possible to also reduce the remaining gap between the facing abutment surfaces 15, which is advantageous for hygienic reasons For hygienic reasons, it may be desirable to close the remaining gap between the through recess 20 and the outer peripheral surface 13. This may be done by externally painting, anodizing, or coating the frame 2, or by covering the frame 2 with an adhesive film. The remaining gap could also be filled in with sealant when the through recess 20 is filled in by sealant 26.

A method for producing a frame 2 according to the invention could proceed as follows:

cutting the frame parts 2a, 2b, 2c, 2d from section bars, and simultaneously forming the abutment surfaces 15, for example, by mitering;

laying against one another in a contiguous manner and optionally fixing the frame parts 2a, 2b, 2c, 2d into a frame 2;

joining the frame parts 2a, 2b, 2c, 2d, preferably by welding the frame parts 2a, 2b, 2c, 2d at the inner corners;

introducing the through recess 20 in the region of the abutment surfaces 15 or forming the through recess 20 in the region of the abutment surfaces 15 by joining the frame parts 2a, 2b, 2c, 2d; and filling in the through recess 20 with a sealant 26.

Thereafter, the frame 2 could also be externally painted, anodized, coated, or covered with an adhesive film.

This method of production offers the ability to prepare a frame that meets the high demands for tightness, and optionally also hygiene, and that requires no post-processing. In particular, there is no need for elaborate post-process of a welding point, or for removal of leaked adhesive or soldered strut. In addition, production can be fully automated. Both make the method of production especially economical.

Producing the input and output device 1 now only requires setting the input and output unit 4 in the frame 2, wherein preferably a sealing element 21 is to be arranged between the frame 2 and the input and output unit 4. In a preferred embodiment, a suitable adhesive is dispensed so as to be closed over the circumference on the finished frame 2 or on the input and output unit 4, on a point provided therefore, following which the input and output unit 4 is pressed onto the frame 2 until the adhesive is cured.

The invention claimed is:

1. A frame for an input and output device, comprising:
    a plurality of individual frame parts having abutment surfaces, wherein directly abutting abutment surfaces of adjacently arranged individual frame parts are joined together;
    a through recess, which is connected to an abutment surface, connects a first end face of the frame to an opposite second end face of the frame; and
    a sealant filling the through recess.

2. The frame according to claim 1, further comprising: a peripheral groove provided on the first end face, wherein the through recess connects a bottom of the peripheral groove to the opposite second end face.

3. The frame according to claim 1, further comprising: a sealing recess provided on the second end face of the frame, wherein the through recess connects a bottom of the sealing recess to the first end face.

4. The frame according to claim 3, further comprising: a peripheral collar having a closed circumference that forms the first end face.

5. An input and output device for industrial applications, comprising the frame according to claim 1, wherein an input and output unit is set into a centrally continuous recess of the frame.

6. The input and output device according to claim 5, further comprising: a sealing element arranged between the frame and the input and output unit.

7. The input and output device according to claim 5, further comprising: a cover film, which covers at least a gap between the frame and the input and output unit.

8. A method for producing a frame for an input and output device, comprising:
    cutting frame parts from a section bar to form abutment surfaces;
    laying the frame parts next to each other in a contiguous manner;
    joining abutting abutment surfaces to form the frame;
    forming a through recess in a region of the abutment surfaces that is connected to the abutting abutment surfaces; and
    filling the through recess with a sealant.

9. The method according to claim 8, wherein an exterior of the frame is at least partially painted, anodized, coated, or covered with an adhesive film.

10. A method for producing an input and output device, comprising:
    producing the frame according to claim 8; and
    setting an input and output unit into a central recess of the frame.

11. The method according to claim 10, further comprising: arranging a sealing element that is closed over a circumference between the input and output unit and the frame.

12. The method according to claim 10, wherein the frame has an outer end face and the method further comprises: adhering a cover film over the input and output unit and the outer end face of the frame so that the cover film covers at least a gap between the frame and the input and output unit.

* * * * *